United States Patent
Chin et al.

(10) Patent No.: US 7,989,941 B2
(45) Date of Patent: Aug. 2, 2011

(54) INTEGRATED CIRCUIT PACKAGE SYSTEM WITH SUPPORT STRUCTURE FOR DIE OVERHANG

(75) Inventors: Chee Keong Chin, Shanghai (CN); Guo Qiang Shen, Shanghai (CN); Ya Ping Wang, Shanghai (CN)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/051,267

(22) Filed: Mar. 19, 2008

(65) Prior Publication Data

US 2009/0236751 A1 Sep. 24, 2009

(51) Int. Cl.
  *H01L 23/49* (2006.01)
  *H01L 21/56* (2006.01)

(52) U.S. Cl. .......... 257/686; 257/777; 257/E21.502; 257/E23.024; 438/109

(58) Field of Classification Search .......... 257/686, 257/777, E21.502, E23.024; 438/109
See application file for complete search history.

(56) References Cited

U.S. PATENT DOCUMENTS

| 7,327,004 B2 * | 2/2008 | Hattori et al. ............ 257/415 |
| 2006/0043559 A1 * | 3/2006 | Chow et al. ............ 257/686 |
| 2006/0267173 A1 | 11/2006 | Takiar et al. |
| 2007/0287227 A1 * | 12/2007 | Huddleston et al. ......... 438/109 |

\* cited by examiner

*Primary Examiner* — Victor Mandala
*Assistant Examiner* — Whitney Moore
(74) *Attorney, Agent, or Firm* — Mikio Ishimaru

(57) ABSTRACT

An integrated circuit package system including: providing a substrate having a support mounted thereover; mounting an integrated circuit die above the substrate; mounting a wire-bonded die offset above the integrated circuit die creating an overhang supported by the support; connecting the wire-bonded die to the substrate with bond wires; and encapsulating the integrated circuit die, the wire-bonded die and the bond wires with an encapsulation.

20 Claims, 4 Drawing Sheets

INTEGRATED CIRCUIT PACKAGE SYSTEM WITH SUPPORT STRUCTURE FOR DIE OVERHANG

TECHNICAL FIELD

The present invention relates generally to an integrated circuit package system, and more particularly to an integrated circuit system-in-package.

BACKGROUND ART

With the explosion of the Internet, the global, internet-driven economy is motivating the burgeoning mobile data content and applications markets. Portable electronic devices such as laptop computers, cell phones, personnel digital assistants (PDA's), handheld or portable game consoles and other portable electronic devices, all use standard integrated-circuits (ICs).

The packages encase many varieties of ICs, such as microprocessors, application specific ICs, cache and system memory, and range from packaging a single ICs to multiple ICs. The considerations for packaging are generally similar. For example, packages are desired that are relatively inexpensive, are mechanically stable, are properly sized and can reliably distribute electric signals between various circuits and components while removing unwanted heat and offering protection in hostile environments.

Further, the IC packaging industry has been subject to the intense cost/performance market pressure common to the microelectronics industry. As a result of this market pressure, IC packaging has increasingly pushed the technology towards increased density, smaller form, and lower cost. The art of packaging ICs has continued to evolve and today represents a tremendous engineering challenge as IC packages become smaller and more component dense.

The latest generations of wireless products are requiring increasingly more functionality in less space, with lower weight, less power consumption, and at higher frequencies, and this is driving the utilization of smaller, fragile passive components for system-in-package (SIP) modules. Assembling these components present a number of challenges for an electronic manufacturing operation.

Thus, a need still remains to protect these fragile components in the wire-bonding phases of manufacture. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system-in-package package system including: providing a substrate having a support mounted thereover; mounting an integrated circuit die above the substrate; mounting a wire-bonded die offset above the integrated circuit die creating an overhang supported by the support; connecting the wire-bonded die to the substrate with bond wires; and encapsulating the integrated circuit die, the wire-bonded die and the bond wires with an encapsulation.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
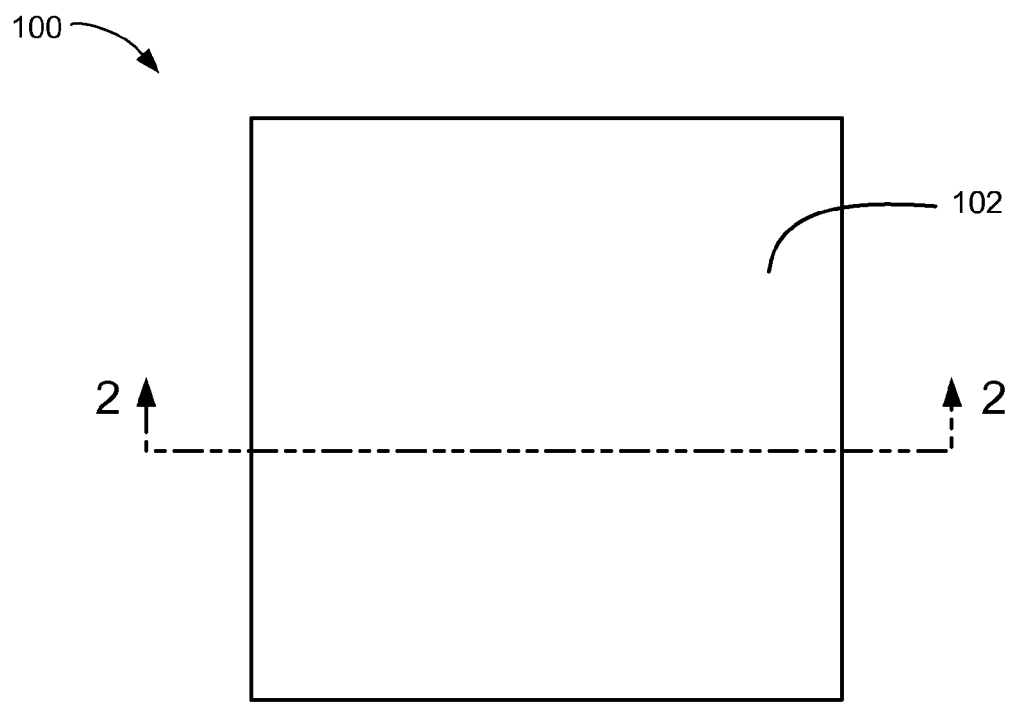
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. Also, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "system" as used herein refers to and is defined as the method and as the apparatus of the present invention in accordance with the context in which the term is used.

Referring now to FIG. 1, therein is shown a top view of an integrated circuit package system 100, in a first embodiment of the present invention. The top view depicts the integrated circuit package system 100, such as a system-in-package (SIP) with an encapsulation 102, such as an epoxy mold compound (EMC).

Figure 2:
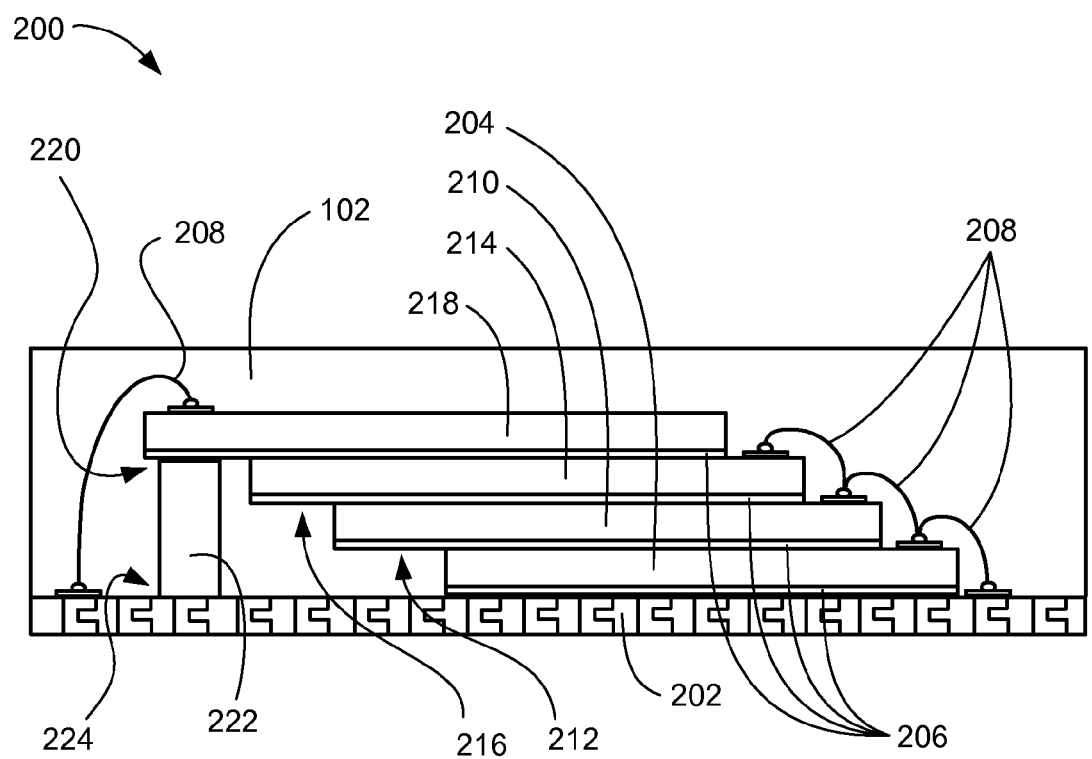
FIG. 2 is a cross sectional view of the integrated circuit package system along the line 2-2 of FIG. 1.

Referring now to FIG. 2, therein is shown a cross sectional view of the integrated circuit package system 100 along the line 2-2 of FIG. 1. The integrated circuit package system 100 includes a substrate 202, such as a laminated plastic or ceramic.

Above the substrate 202 is shown an integrated circuit (IC) die, such as a first wire-bonded die 204. The first wire-bonded die 204 may be mounted to the substrate 202 with a die attach adhesive 206. The first wire-bonded die 204 may be electrically connected to the substrate 202 with electrical interconnects, such as bond wires 208.

In a manner similar to the first wire-bonded die 204, a second IC die, such as a second wire-bonded die 210, may be attached to the first wire-bonded die 204 with the die attach adhesive 206. The second wire-bonded die 210 may be placed having an offset substantially exposing the bond wires 208 connected to the first wire-bonded die 204.

The second wire-bonded die 210 may also be electrically connected to the first wire-bonded die 204 with the bond wires 208. The placement of the second wire-bonded die 210 creates an overhang 212 exposing the second wire-bonded die 210 above the first wire-bonded die 204.

In a manner similar to the second wire-bonded die 210, a third IC die, such as a third wire-bonded die 214, may be attached to the second wire-bonded die 210 with the die attach adhesive 206. The third wire-bonded die 214 may be placed having an offset substantially exposing the bond wires 208 connected to the second wire-bonded die 210.

The third wire-bonded die 214 may also be electrically connected to the second wire-bonded die 210 with the bond wires 208. The placement of the third wire-bonded die 214 creates an overhang 216 exposing the third wire-bonded die 214 above the second wire-bonded die 210.

In a manner similar to the third wire-bonded die 214, a wire-bonded die, such as a fourth wire-bonded die 218, may be attached to the third wire-bonded die 214 with the die attach adhesive 206. The fourth wire-bonded die 218 may be placed having an offset substantially exposing the bond wires 208 connected to the third wire-bonded die 214.

The fourth wire-bonded die 218 may also be electrically connected to the third wire-bonded die 214 with the bond wires 208. The placement of the fourth wire-bonded die 218 creates an overhang 220 exposing the fourth wire-bonded die 218 above the third wire-bonded die 214.

Beneath the overhang 220 is a support, such as a spacer 222. The spacer 222 may be a rigid organic or inorganic pillar and may be attached to the substrate 202 by contact 224. The encapsulation 102 is shown encapsulating the first wire-bonded die 204, the second wire-bonded die 210, the third wire-bonded die 214, the fourth wire-bonded die 218, the spacer 222, and the bond wires 208.

It has been unexpectedly discovered that the use of the support is a novel and cost effective way to solve the recently developing problem of wire-bonded die 218 cracking which may occur during the wire-bonding of integrated circuits having the overhang 220.

Figure 3:
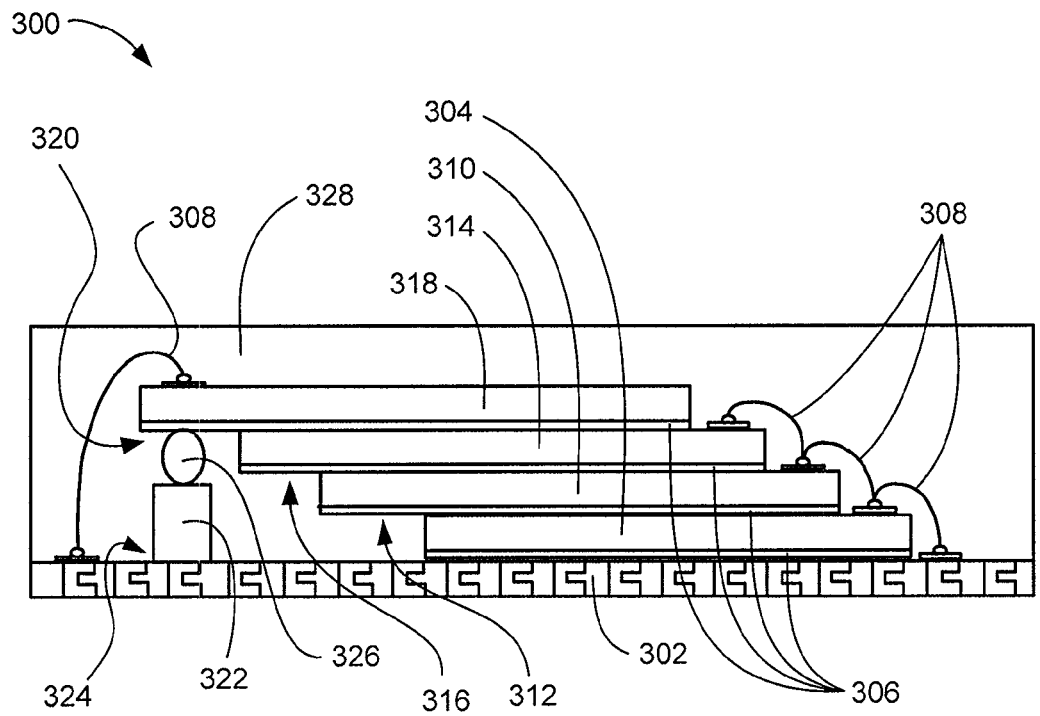
FIG. 3 is a cross sectional view of the integrated circuit package system in a second embodiment of the present invention.

Referring now to FIG. 3, therein is shown a cross sectional view of an integrated circuit package system 300 in a second embodiment of the present invention. The integrated circuit package system 300 includes a substrate 302, such as a laminated plastic or ceramic.

Above the substrate 302 is shown an integrated circuit (IC) die, such as a first wire-bonded die 304. The first wire-bonded die 304 may be mounted to the substrate 302 with a die attach adhesive 306. The first wire-bonded die 304 may be electrically connected to the substrate 302 with electrical interconnects, such as bond wires 308.

In a manner similar to the first wire-bonded die 304, a second IC die, such as a second wire-bonded die 310, may be attached to the first wire-bonded die 304 with the die attach adhesive 306. The second wire-bonded die 310 may be placed having an offset substantially exposing the bond wires 308 connected to the first wire-bonded die 304.

The second wire-bonded die 310 may also be electrically connected to the first wire-bonded die 304 with the bond wires 308. The placement of the second wire-bonded die 310 creates an overhang 312 exposing the second wire-bonded die 310 above the first wire-bonded die 304.

In a manner similar to the second wire-bonded die 310, a third IC die, such as a third wire-bonded die 314, may be attached to the second wire-bonded die 310 with the die attach adhesive 306. The third wire-bonded die 314 may be placed having an offset substantially exposing the bond wires 308 connected to the second wire-bonded die 310.

The third wire-bonded die 314 may also be electrically connected to the second wire-bonded die 310 with the bond wires 308. The placement of the third wire-bonded die 314 creates an overhang 316 exposing the third wire-bonded die 314 above the second wire-bonded die 310.

In a manner similar to the third wire-bonded die 314, a wire-bonded die, such as a fourth wire-bonded die 318, may be attached to the third wire-bonded die 314 with the die attach adhesive 306. The fourth wire-bonded die 318 may be placed having an offset substantially exposing the bond wires 308 connected to the third wire-bonded die 314.

The fourth wire-bonded die 318 may also be electrically connected to the third wire-bonded die 314 with the bond wires 308. The placement of the fourth wire-bonded die 318 creates an overhang 320 exposing the fourth wire-bonded die 318 above the third wire-bonded die 314.

Beneath the overhang 320 is a support, such as a spacer 322. The spacer 322 may be a rigid organic or inorganic pillar and may be attached to the substrate 302 by contact 324. Between the fourth wire-bonded die 318 and the spacer 322 is an adhesive 326 that is an uninterrupted continuous adhesive layer covering the bottom surface of the fourth wire-bonded die 318. An encapsulation 328 is shown encapsulating the first wire-bonded die 304, the second wire-bonded die 310, the third wire-bonded die 314, the fourth wire-bonded die 318, the spacer 322, and the bond wires 308.

Figure 4:
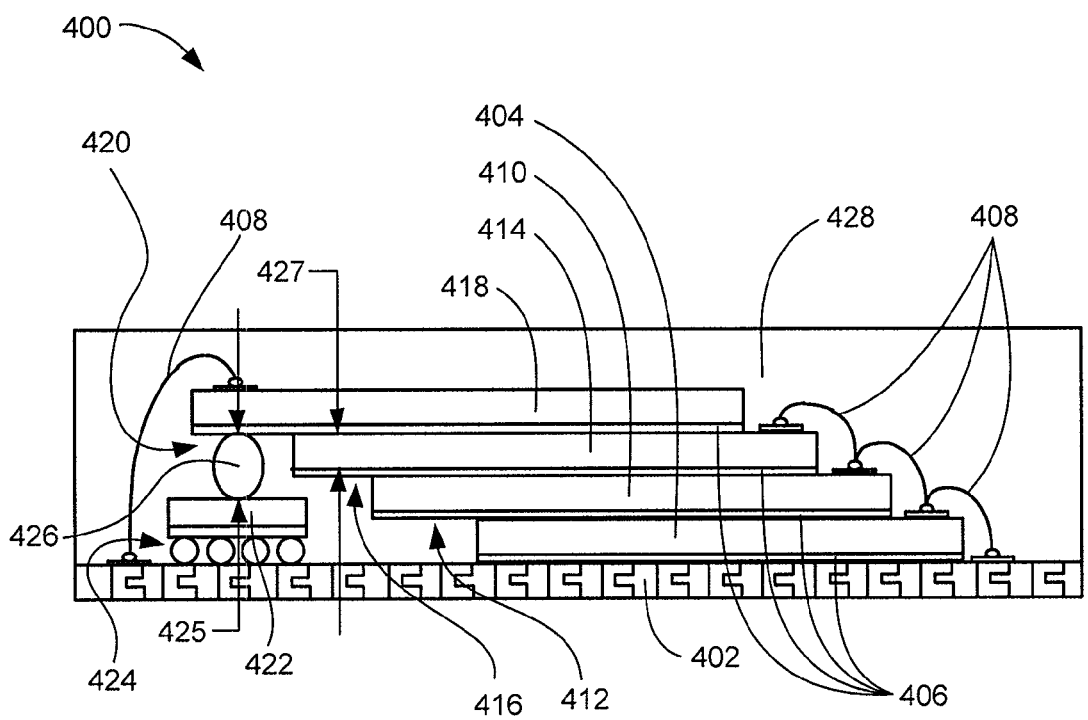
FIG. 4 is a cross sectional view of the integrated circuit package system in a third embodiment of the present invention.

Referring now to FIG. 4, therein is shown a cross sectional view of an integrated circuit package system 400 in a third embodiment of the present invention. The system 400 includes a substrate 402, such as a laminated plastic or ceramic.

Above the substrate 402 is shown an integrated circuit (IC) die, such as a first wire-bonded die 404. The first wire-bonded die 404 may be mounted to the substrate 402 with a die attach adhesive 406. The first wire-bonded die 404 may be electrically connected to the substrate 402 with electrical interconnects, such as bond wires 408.

In a manner similar to the first wire-bonded die 404, a second IC die, such as a second wire-bonded die 410, may be attached to the first wire-bonded die 404 with the die attach adhesive 406. The second wire-bonded die 410 may be placed having an offset substantially exposing the bond wires 408 connected to the first wire-bonded die 404.

The second wire-bonded die 410 may also be electrically connected to the first wire-bonded die 404 with the bond wires 408. The placement of the second wire-bonded die 410 creates an overhang 412 exposing the second wire-bonded die 410 above the first wire-bonded die 404.

In a manner similar to the second wire-bonded die 410, a third IC die, such as a third wire-bonded die 414, may be attached to the second wire-bonded die 410 with the die attach adhesive 406. The third wire-bonded die 414 may be placed having an offset substantially exposing the bond wires 408 connected to the second wire-bonded die 410.

The third wire-bonded die 414 may also be electrically connected to the second wire-bonded die 410 with the bond wires 408. The placement of the third wire-bonded die 414 creates an overhang 416 exposing the third wire-bonded die 414 above the second wire-bonded die 410.

In a manner similar to the third wire-bonded die 414, a wire-bonded die, such as a fourth wire-bonded die 418, may be attached to the third wire-bonded die 414 with the die attach adhesive 406. The fourth wire-bonded die 418 may be placed having an offset substantially exposing the bond wires 408 connected to the third wire-bonded die 414.

The fourth wire-bonded die 418 may also be electrically connected to the third wire-bonded die 414 with the bond wires 408. The placement of the fourth wire-bonded die 418 creates an overhang 420 exposing the fourth wire-bonded die 418 above the third wire-bonded die 414.

Beneath the overhang 420 is a support, such as a component 422. The component may be a ball grid array (BGA) device such as a crystal oscillator, resistor, or capacitor, and may be attached to the substrate 402 with a BGA 424. Between the fourth wire-bonded die 418 and the BGA device 422 is an adhesive 426 having a thickness 425 larger than a thickness 427 of the third wire-bonded die 414. An encapsulation 428 is shown encapsulating the first wire-bonded die 404, the second wire-bonded die 410, the third wire-bonded die 414, the fourth wire-bonded die 418, the BGA device 422, and the bond wires 408.

It has been unexpectedly discovered that with the solving of one problem, namely weak silicon with the overhang 420 breaking during wire-bonding, a further benefit of the invention is the shrinking of the overall footprint of the package because more previously unused space is now filled with components.

Figure 5:
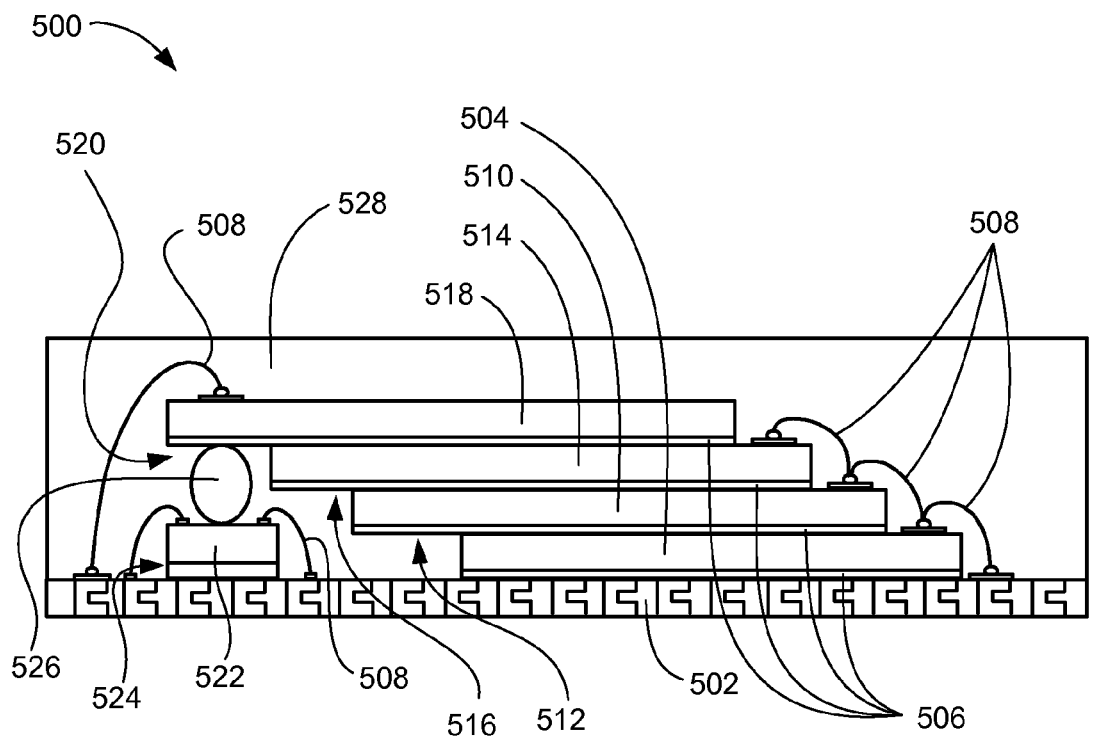
FIG. 5 is a cross sectional view of the integrated circuit package system in a fourth embodiment of the present invention.

Referring now to FIG. 5, therein is shown a cross sectional view of an integrated circuit package system 500 in a fourth embodiment of the present invention. The system 500 includes a substrate 502, such as a laminated plastic or ceramic.

Above the substrate 502 is shown an integrated circuit (IC) die, such as a first wire-bonded die 504. The first wire-bonded die 504 may be mounted to the substrate 502 with a die attach adhesive 506. The first wire-bonded die 504 may be electrically connected to the substrate 502 with electrical interconnects, such as bond wires 508.

In a manner similar to the first wire-bonded die 504, a second IC die, such as a second wire-bonded die 510, may be attached to the first wire-bonded die 504 with the die attach adhesive 506. The second wire-bonded die 510 may be placed having an offset substantially exposing the bond wires 508 connected to the first wire-bonded die 504.

The second wire-bonded die 510 may also be electrically connected to the first wire-bonded die 504 with the bond wires 508. The placement of the second wire-bonded die 510 creates an overhang 512 exposing the second wire-bonded die 510 above the first wire-bonded die 504.

In a manner similar to the second wire-bonded die 510, a third IC die, such as a third wire-bonded die 514, may be attached to the second wire-bonded die 510 with the die attach adhesive 506. The third wire-bonded die 514 may be placed having an offset substantially exposing the bond wires 508 connected to the second wire-bonded die 510.

The third wire-bonded die 514 may also be electrically connected to the second wire-bonded die 510 with the bond wires 508. The placement of the third wire-bonded die 514 creates an overhang 516 exposing the third wire-bonded die 514 above the second wire-bonded die 510.

In a manner similar to the third wire-bonded die 514, a wire-bonded die, such as a fourth wire-bonded die 518, may be attached to the third wire-bonded die 514 with the die attach adhesive 506. The fourth wire-bonded die 518 may be placed having an offset substantially exposing the bond wires 508 connected to the third wire-bonded die 514.

The fourth wire-bonded die 518 may also be electrically connected to the third wire-bonded die 514 with the bond wires 508. The placement of the fourth wire-bonded die 518 creates an overhang 520 exposing the fourth wire-bonded die 518 above the third wire-bonded die 514.

Beneath the overhang 520 is a support, such as a component 522. The component may be a wire-bond device such as a crystal oscillator, resistor, or capacitor, and may be attached to the substrate 502 with adhesive 524. Between the fourth wire-bonded die 518 and the wire-bond device 522 is an adhesive 526. An encapsulation 528 is shown encapsulating the first wire-bonded die 504, the second wire-bonded die 510, the third wire-bonded die 514, the fourth wire-bonded die 518, the wire-bond device 522, and the bond wires 508.

Figure 6:
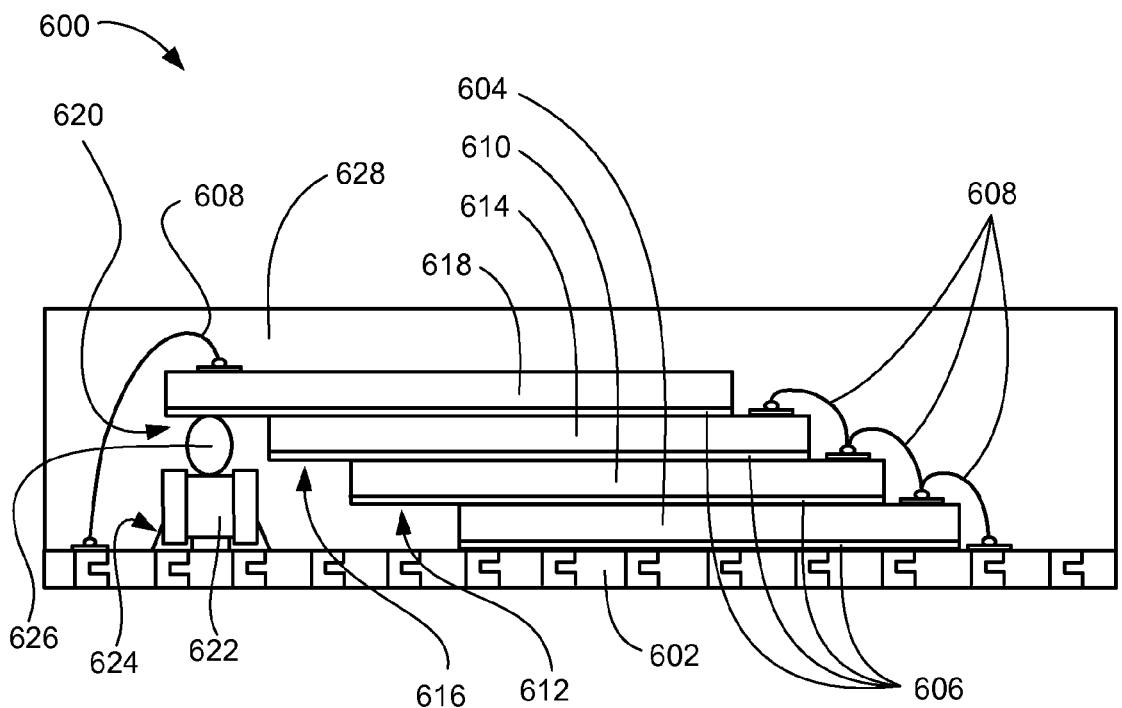
FIG. 6 is a cross sectional view of the integrated circuit package system in a fifth embodiment of the present invention.

Referring now to FIG. 6, therein is shown a cross sectional view of an integrated circuit package system 600 in a fifth embodiment of the present invention. The system 600 includes a substrate 602, such as a laminated plastic or ceramic.

Above the substrate 602 is shown an integrated circuit (IC) die, such as a first wire-bonded die 604. The first wire-bonded die 604 may be mounted to the substrate 602 with a die attach adhesive 606. The first wire-bonded die 604 may be electrically connected to the substrate 602 with electrical interconnects, such as bond wires 608.

In a manner similar to the first wire-bonded die 604, a second IC die, such as a second wire-bonded die 610, may be attached to the first wire-bonded die 604 with the die attach adhesive 606. The second wire-bonded die 610 may be placed having an offset substantially exposing the bond wires 608 connected to the first wire-bonded die 604.

The second wire-bonded die 610 may also be electrically connected to the first wire-bonded die 604 with the bond wires 608. The placement of the second wire-bonded die 610 creates an overhang 612 exposing the second wire-bonded die 610 above the first wire-bonded die 604.

In a manner similar to the second wire-bonded die 610, a third IC die, such as a third wire-bonded die 614, may be attached to the second wire-bonded die 610 with the die attach adhesive 606. The third wire-bonded die 614 may be placed having an offset substantially exposing the bond wires 608 connected to the second wire-bonded die 610.

The third wire-bonded die 614 may also be electrically connected to the second wire-bonded die 610 with the bond wires 608. The placement of the third wire-bonded die 614 creates an overhang 616 exposing the third wire-bonded die 614 above the second wire-bonded die 610.

In a manner similar to the third wire-bonded die 614, a wire-bonded die, such as a fourth wire-bonded die 618, may be attached to the third wire-bonded die 614 with the die attach adhesive 606. The fourth wire-bonded die 618 may be placed having an offset substantially exposing the bond wires 608 connected to the third wire-bonded die 614.

The fourth wire-bonded die 618 may also be electrically connected to the third wire-bonded die 614 with the bond wires 608. The placement of the fourth wire-bonded die 618 creates an overhang 620 exposing the fourth wire-bonded die 618 above the third wire-bonded die 614.

Beneath the overhang 620 is a support, such as a component 622. The component may be a surface mount device such as a crystal oscillator, resistor, or capacitor, and may be attached to the substrate 602 with a surface mount 624. Between the fourth wire-bonded die 618 and the wire-bond device 622 is an adhesive 626. An encapsulation 628 is shown encapsulating the first wire-bonded die 604, the second wire-bonded die 610, the third wire-bonded die 614, the fourth wire-bonded die 618, the wire-bond device 622, and the bond wires 608.

Figure 7:
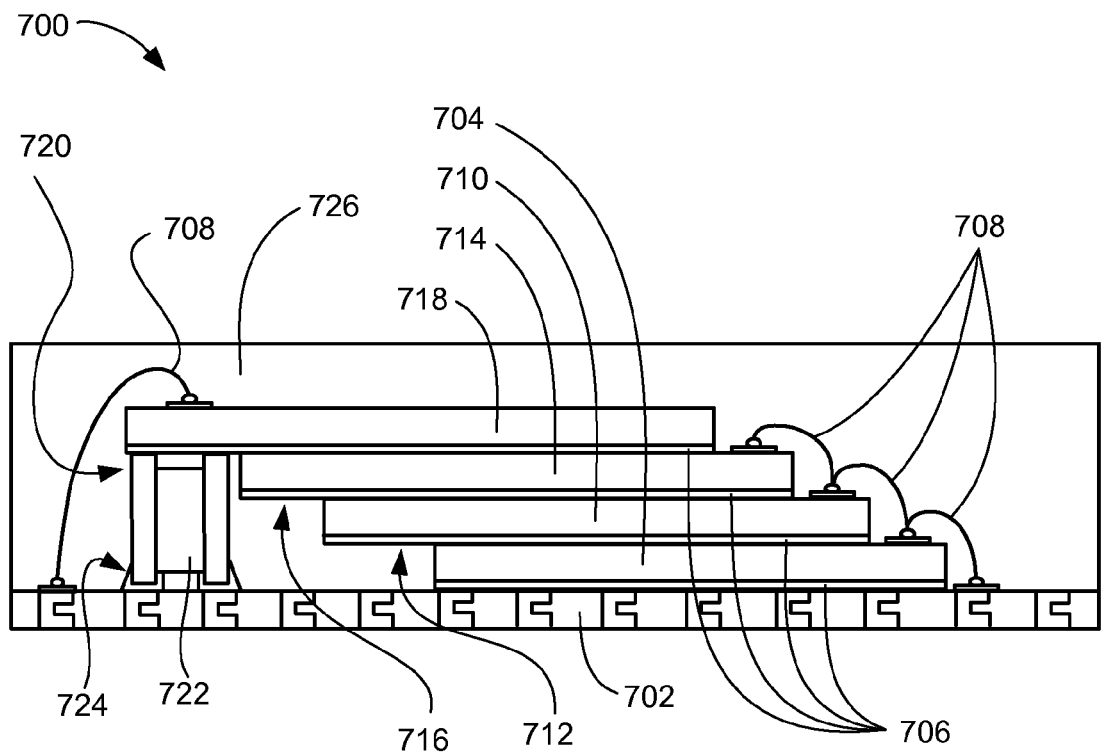
FIG. 7 is a cross sectional view of the integrated circuit package system in a sixth embodiment of the present invention.

Referring now to FIG. 7, therein is shown a cross sectional view of an integrated circuit package system 700 in a sixth embodiment of the present invention. The system 700 includes a substrate 702, such as a laminated plastic or ceramic.

Above the substrate 702 is shown an integrated circuit (IC) die, such as a first wire-bonded die 704. The first wire-bonded die 704 may be mounted to the substrate 702 with a die attach adhesive 706. The first wire-bonded die 704 may be electrically connected to the substrate 702 with electrical interconnects, such as bond wires 708.

In a manner similar to the first wire-bonded die 704, a second IC die, such as a second wire-bonded die 710, may be attached to the first wire-bonded die 704 with the die attach adhesive 706. The second wire-bonded die 710 may be placed having an offset substantially exposing the bond wires 708 connected to the first wire-bonded die 704.

The second wire-bonded die 710 may also be electrically connected to the first wire-bonded die 704 with the bond wires 708. The placement of the second wire-bonded die 710 creates an overhang 712 exposing the second wire-bonded die 710 above the first wire-bonded die 704.

In a manner similar to the second wire-bonded die 710, a third IC die, such as a third wire-bonded die 714, may be attached to the second wire-bonded die 710 with the die attach adhesive 706. The third wire-bonded die 714 may be placed having an offset substantially exposing the bond wires 708 connected to the second wire-bonded die 710.

The third wire-bonded die 714 may also be electrically connected to the second wire-bonded die 710 with the bond wires 708. The placement of the third wire-bonded die 714 creates an overhang 716 exposing the third wire-bonded die 714 above the second wire-bonded die 710.

In a manner similar to the third wire-bonded die 714, a wire-bonded die, such as a fourth wire-bonded die 718, may be attached to the third wire-bonded die 714 with the die attach adhesive 706. The fourth wire-bonded die 718 may be placed having an offset substantially exposing the bond wires 708 connected to the third wire-bonded die 714.

The fourth wire-bonded die 718 may also be electrically connected to the third wire-bonded die 714 with the bond wires 708. The placement of the fourth wire-bonded die 718 creates an overhang 720 exposing the fourth wire-bonded die 718 above the third wire-bonded die 714.

Beneath the overhang 720 is a support, such as a component 722. The component may be a surface mount device such as a crystal oscillator, resistor, or capacitor, and may be attached to the substrate 702 with a surface mount 724. An encapsulation 726 is shown encapsulating the first wire-bonded die 704, the second wire-bonded die 710, the third wire-bonded die 714, the fourth wire-bonded die 718, the wire-bond device 722, and the bond wires 708.

Figure 8:
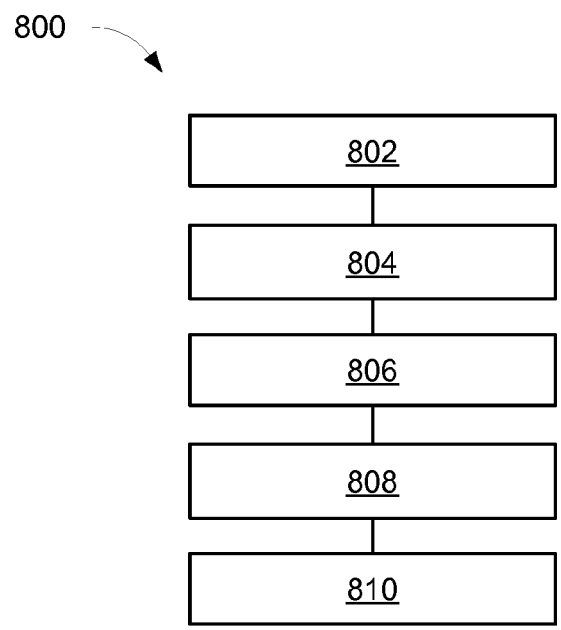
FIG. 8 is a flow chart of a system for an integrated circuit system-in-package package system in an embodiment of the present invention.

Referring now to FIG. 8, therein is shown a flow chart of a system 800 for an integrated circuit system-in-package package system in an embodiment of the present invention. The system 800 includes providing a substrate having a support mounted thereover in a block 802; mounting an integrated circuit die above the substrate in a block 804; mounting a wire-bonded die offset above the integrated circuit die creating an overhang supported by the support in a block 806; connecting the wire-bonded die to the substrate with bond wires in a block 808; and encapsulating the first wire-bonded die, the second wire-bonded die and the bond wires with an encapsulation in a block 810.

It has been discovered that the present invention thus has numerous aspects.

A principle aspect that has been unexpectedly discovered is that the present invention stabilizes the fragile IC die avoiding cracking during wire bonding.

Another aspect is the efficient utilization of empty space in the package, thus reducing the overall footprint of the package saving valuable space, and increasing line yields.

Yet another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a substrate having a support mounted thereover;
   mounting an integrated circuit die above the substrate;
   mounting a wire-bonded die offset above the integrated circuit die creating an overhang supported by the support and attached thereto with an adhesive having a thickness larger than a thickness of the integrated circuit die;
   connecting the wire-bonded die to the substrate and to the integrated circuit die with bond wires; and
   encapsulating the integrated circuit die, the wire-bonded die and the bond wires with an encapsulation.

2. The method as claimed in claim 1 wherein:
   providing a substrate having a support mounted thereover includes having a component mounted thereover.

3. The method as claimed in claim 1 wherein:
   providing a substrate having a support mounted thereover includes having a component mounted thereover and having an adhesive between the wire-bonded die and the component.

4. The method as claimed in claim 1 wherein:
providing a substrate having a support mounted thereover includes having a spacer mounted thereover.

5. The method as claimed in claim 1 wherein:
providing a substrate having a support mounted thereover includes having a spacer mounted thereover.

6. A method for manufacturing an integrated circuit package system comprising:
providing a substrate having a support mounted thereover;
mounting a first wire-bonded die above the substrate with a first die attach adhesive and connecting the first wire-bonded die with a bond wire to the substrate;
mounting a second wire-bonded die offset above the first wire-bonded die creating an overhang supported by the support, and attached to the first wire-bonded die and to the support with a second die attach adhesive having a thickness larger than a thickness of the integrated circuit die;
connecting the second wire-bonded die to the substrate with the bond wires connected above the overhang; and
encapsulating the first wire-bonded die, the second wire-bonded die and the bond wires with an encapsulation.

7. The method as claimed in claim 6 wherein:
providing a substrate having a support mounted thereover includes mounting the support to the substrate with a surface mount.

8. The method as claimed in claim 6 wherein:
providing a substrate having a support mounted thereover includes mounting the support to the substrate with a ball grid array.

9. The method as claimed in claim 6 wherein:
providing a substrate having a support mounted thereover includes mounting the support to the substrate with an adhesive.

10. The method as claimed in claim 6 wherein:
providing a substrate having a support mounted thereover includes mounting the support to the substrate by contact.

11. An integrated circuit package system comprising:
a substrate;
a support mounted over the substrate;
an integrated circuit die mounted above the substrate;
a wire-bonded die mounted offset above the integrated circuit die with an overhang;
an adhesive attached to the support and the overhang having a thickness larger than a thickness of the integrated circuit die and the wire-bonded die connected to the substrate and to the integrated circuit die with bond wires; and
an encapsulation encapsulating the integrated circuit die, the wire-bonded die and the bond wires.

12. The system as claimed in claim 11 wherein:
the support is a component.

13. The system as claimed in claim 11 wherein:
the support is a component attached to the overhang by an adhesive.

14. The system as claimed in claim 11 wherein:
the support is a spacer.

15. The system as claimed in claim 11 wherein:
the support is a spacer.

16. The system as claimed in claim 11 wherein:
the integrated circuit die is a first wire-bonded die mounted above the substrate by die attach adhesive and connected to the substrate with the bond wires; and
the wire-bonded die is a second wire-bonded die mounted to the first wire-bonded die with the die attach adhesive and the bond wires are connected above the overhang.

17. The system as claimed in claim 16 wherein:
the support is mounted to the substrate with a surface mount.

18. The system as claimed in claim 16 wherein:
the support is mounted to the substrate with a ball grid array.

19. The system as claimed in claim 16 wherein:
the support is mounted to the substrate with an adhesive.

20. The system as claimed in claim 16 wherein:
the support is mounted to the substrate by contact.

* * * * *